(12) United States Patent
Shelnut et al.

(10) Patent No.: US 6,759,596 B1
(45) Date of Patent: Jul. 6, 2004

(54) SEQUENTIAL BUILD CIRCUIT BOARD

(75) Inventors: James G. Shelnut, Northboro, MA (US); Charles R. Shipley, Auburndale, MA (US); Robert L. Goldberg, Sharon, MA (US)

(73) Assignee: Shipley Company, Marlborough, MA (US)

( * ) Notice: Subject to any disclaimer, the term of this patent is extended or adjusted under 35 U.S.C. 154(b) by 0 days.

(21) Appl. No.: 09/569,553

(22) Filed: May 12, 2000

(51) Int. Cl.$^7$ ................................................ H05K 1/03
(52) U.S. Cl. ................... 174/255; 174/261; 29/832; 29/847
(58) Field of Search .................. 174/260, 262–266; 29/832, 846, 847

(56) References Cited

U.S. PATENT DOCUMENTS

| | | | | |
|---|---|---|---|---|
| 3,710,196 A | * | 1/1973 | Fifield ................... | 317/101 CC |
| 5,229,550 A | * | 7/1993 | Bindra et al. ............. | 174/262 |
| 5,298,685 A | * | 3/1994 | Bindra et al. ............. | 174/250 |
| 5,374,788 A | * | 12/1994 | Endoh et al. ............. | 174/255 |
| 5,516,988 A | * | 5/1996 | Yamauchi ................ | 174/250 |
| 5,912,654 A | * | 6/1999 | Ouchi et al. .............. | 345/98 |
| 5,993,579 A | * | 11/1999 | Farquhar et al. .......... | 156/280 |
| 6,057,513 A | * | 5/2000 | Ushikoshi et al. ......... | 174/260 |
| 6,288,347 B1 | * | 9/2001 | Nakagawa et al. ........ | 174/261 |
| 6,291,775 B1 | * | 9/2001 | Saitoh .................... | 174/250 |
| 6,379,781 B1 | * | 4/2002 | Suzuki et al. ............. | 428/209 |
| 6,392,160 B1 | * | 5/2002 | Andry et al. ............. | 174/261 |
| 6,407,341 B1 | * | 6/2002 | Anstrom et al. .......... | 174/255 |
| 6,559,388 B1 | * | 5/2003 | Kresge et al. ............ | 174/252 |

* cited by examiner

*Primary Examiner*—Kamand Cuneo
*Assistant Examiner*—Jeremy C. Norris
(74) *Attorney, Agent, or Firm*—Peter F. Corless; Darryl P. Frickey; Edwards & Angell, LLP

(57) ABSTRACT

The invention provides multilayer circuit boards and methods for formation of a sequential build circuit board. Among other things, glass fiber reinforced copper clad epoxy substrates, required to provide strength or rigidity to prior boards, are not required for preferred circuit boards of the invention. Preferred methods of the invention include applying a dielectric coating onto a support; forming recesses in the dielectric coating that define openings including opening for at least one reinforcing member; depositing copper metal into the recesses to form a first layer; applying a second dielectric coating onto the first circuit layer; forming recesses in the second dielectric coating that define openings including openings for at least one reinforcing member in registration with the one or more reinforcing members in the first layer; depositing metal into the recesses in the dielectric coating to form the second layer; and repeating the process to form sequential build board having the desired number of layers.

23 Claims, 2 Drawing Sheets

SEQUENTIAL BUILD CIRCUIT BOARD

BACKGROUND OF THE INVENTION

1. Introduction

This invention relates to new multilayered circuit boards and to processes for manufacture of the same. More particularly, the invention relates to new multilayered circuit boards having capacity for increased chip and other component attachment and further characterized by increased circuit density. The multilayered circuit boards are formed by new sequential build procedures.

2. Description of the Prior Art

Multilayer circuit boards (MLBs) permit formation of multiple circuits in a minimum volume or space. They typically comprise a stack of layers where layers of signal lines (conductors) are separated from each other by a layer of dielectric material. The signal lines are in electrical contact with each other by plated holes passing through the dielectric layers. The plated holes are often referred to as "vias". Such stacks also typically contain power and ground planes.

Known processes for fabricating MLBs are extensions of methods used for fabricating double-sided circuit boards. A typical method comprises fabrication of separate innerlayer circuits. The circuits are formed by coating a photosensitive layer or film over the copper of a copper clad innerlayer base material. The photosensitive coating is imaged, developed and etched to form conductor lines. After etching, the photosensitive film is stripped from the copper leaving the circuit pattern on the surface of the innerlayer base material.

Following formation of individual innerlayer circuits, a multilayer stack is formed by preparing a lay-up of innerlayers, ground planes, power planes, etc., typically separated from each other by a dielectric pre-preg comprising a layer consisting of glass cloth impregnated with partially cured material, typically a B-stage epoxy resin. The top and bottom outer layers of the stack comprise copper clad, glass filled, epoxy planar boards with the copper cladding comprising exterior surfaces of the stack. The stack is laminated to form a monolithic structure using heat and pressure to fully cure the B-stage resin. The stack so formed has copper cladding on both of its exterior surfaces. Exterior circuit layers are formed in the copper cladding using procedures similar to the procedures used to form the innerlayer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

Vias or interconnects are used to electrically connect individual circuit layers within an MLB to each other and to the outer surfaces and typically pass through all or a portion of the stack. Vias are generally formed prior to the formation of circuits on the exterior surfaces by drilling holes through the stack at appropriate locations. Following several pretreatment steps, the walls of the vias are catalyzed by contact with a plating catalyst and metallized, typically by contact with an electroless copper plating solution to form conductive pathways between circuit layers. Following formation of the vias, exterior circuits, or outerlayers are formed using the procedure described above.

To construct an electronic device using an MLB, chips and other electrical components are mounted at appropriate locations on the exterior circuit layers of the multilayer stack, typically using solder mount pads to bond the components to the MLB. The components are in electrical contact with the circuits within the MLB through the conductive vias. The pads are formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and exposed and developed to yield an array of openings defining the pads. The openings are then coated with solder using procedures known to the art such as wave soldering.

The uses, advantages and fabrication techniques for the manufacture of multilayer boards are described by Coombs, *Printed Circuits Handbook,* McGraw Hill Book Company, New York, $2^{nd}$ Edition, pp. 20-3–23-19, 1979, incorporated herein by reference.

MLBs have become increasingly complex. For example, boards for main frame computers may have as many as 36 layers of circuitry or more, with the complete stack having a thickness of about ¼ inch. These boards are typically designed with 4 or 5 mil wide signal lines and 12 mil diameter vias. For increased densification, the industry desires to reduce signal lines to a width of 2 mils or less and vias to a diameter of 2 to 5 mils or less. Known commercial procedures now used are incapable of economically forming the dimensions desired by the industry.

In addition to decreasing line width and via diameter, the industry also desires to avoid manufacturing problems frequently associated with MLB manufacture. As described above, current procedures utilize innerlayer materials that are glass-reinforced resin layers having a thickness of from about 4 to 5 mils clad with copper on both surfaces. The glass reinforcing material is used to contribute strength and rigidity to the MLB stack. However, since lamination is at a temperature above 150° C., the resinous portion of the laminate shrinks during cooling to the extent permitted by the rigid copper cladding. If the copper is etched to form a discontinuous pattern, laminate shrinkage may not be restrained by the copper cladding. This problem is exacerbated as feature size decreases. Consequently, further shrinkage may occur. The shrinkage may have an adverse affect on dimensional stability and registration between board layers.

As described above, to form the MLB, a first step involves lay-up of layers prior to lamination. Care must be exercised to avoid shifting of the innerlayers during lamination. Otherwise, the layers will not be aligned and electrical contact between layers will not be achieved. In addition, during lay-up, air is often trapped in spaces adjacent to signal lines because a solid pre-preg is laid over the signal lines that does not completely fill all recesses between signal lines. Care must be taken to evacuate entrapped air. Residual air pockets can cause defects and subsequent problems during use of the multilayer board.

The use of glass reinforced inner and outerlayer materials creates additional problems. The glass fiber is needed for board strength. However, when holes are drilled to form vias, glass fibers extend into the holes and must be removed prior to metallization. Removal creates the need for additional pretreatment steps such as the use of glass etchants to remove glass fibrils extending into the holes. If the glass is not removed, a loss of continuity might occur in the metal deposit. In addition, the glass fibers add weight and thickness to the overall MLB.

The attachment of chips and other electrical components to a finished MLB adds additional, costly processing steps to the overall fabrication of an electronic device. Solder mask must be applied and imaged after the MLB is completed. The solder mask is screened onto a board through a screen or applied as a coating and then imaged. Solder is then applied such as by floating the board on a bath of molten solder. The elevated temperatures cause differential expansion of layers within the board resulting in undesirable pressures within the MLB.

An improvement in methods for manufacture of MLBs is disclosed in U.S. Pat. No. 5,246,817 incorporated herein by reference, hereafter the "'817 patent". In accordance with the procedures of the '817 patent, manufacture of the MLB comprises sequential formation of layers using photosensitive dielectric coatings and selective metal deposition procedures. In accordance with the process of the patent, the first layer of the board is formed over a temporary or permanent carrier that may become an integral part of the board. When the carrier is a circuit, the process comprises formation of a dielectric coating over the circuit with imaged openings defining the vias. The imaged openings may be obtained by exposure of a photosensitive dielectric coating to activating radiation through a mask in an imaged pattern followed by development to form the imaged openings. Alternatively, imaging may be by laser ablation in which case the dielectric material need not be photosensitive. Metal is deposited into the recesses within the dielectric coating to form vias. Thereafter, an additional layer of dielectric is coated onto the first dielectric layer, imaged in a pattern of circuit lines, and the recesses are then plated with metal. Alternatively, after imaging the first dielectric coating, it may be coated with a second dielectric coating and imaged and the recesses plated with metal to form the vias and circuit lines simultaneously. By either process, the walls of the imaged opening or recesses in the dielectric coating contain metal as it deposits during plating and assures a desired cross-sectional shape of the deposit. Plating desirably fills the entire recess within the imaged photosensitive coating. The process is repeated sequentially to form sequential layers of circuits and vias.

The procedures disclosed in the '817 patent include alternative selective metal plating methods whereby metal is selectively deposited within the imaged openings to render the same conductive. The procedures disclosed in the patent involves selectively depositing metal in imaged openings without increase in the surface resistivity of an underlying substrate between conductor lines. Selective metal deposition may be performed by several new techniques disclosed in said patent to avoid increased conductivity between signal lines. The selective deposition procedures of the '817 patent typically involve multiple coating steps using sacrificial layers.

The process of the '817 patent is an advance in the art. For example, to obtain imaged openings in a dielectric coating, the coating is exposed to activating radiation in an image pattern and developed or laser ablated in a pattern to yield a relief image. The resolution of the imaged openings is dependent upon the imaging process and materials used. Photosensitive dielectric coatings may be capable of development to yield high resolution relief images including openings that are smaller than the thickness of the coating. By use of such coatings, imaged openings for vias and conductors can be of a size equivalent to the resolution capability of the dielectric material and the method of imaging. Accordingly, the cross section or configuration of a feature may be in any desired shape with a dimension far smaller than obtainable using prior art procedures. In addition, the MLBs are made without use of glass reinforced epoxy innerlayer materials. Therefore, the final MLB is free of the glass reinforcement conventionally used in the fabrication of MLBs. This is an advantage as it eliminates many problems associated with conventional MLB manufacture. For example, problems and preparative steps associated with glass fibers extending into via openings during metallization are avoided. Without the glass reinforced innerlayer material, the overall thickness of the stack is reduced. Registration problems encountered during lay-up of the stack are eliminated. Shrinkage caused by thermal cure of the B stage epoxy resin in the conventional process is avoided because a thermal cure step is not required by the process of the '817 patent.

Though the process of the '817 avoids many of the problems noted above, it would be desirable to further simplify the process, especially by avoidance of electroless metal deposition procedures to form circuit lines and vias, multiple coating steps to enable selective plating, and use of molten solder to form solder mount pads.

SUMMARY OF THE INVENTION

The subject invention provides new multiple layer high density circuit boards and methods for making the same. The circuit boards are characterized by an increased density of preformed solder mount pads on one or both outerlayer surfaces thereby permitting the packing of an increased number of chips and other electrical components onto said surfaces, circuits having circuit lines and interconnects of decreased dimension formed within the confines of a permanent dielectric coating, sequentially built reinforcing members that can function as both power and ground planes in a vertical or horizontal orientation if desired, and the elimination of rigid glass reinforced supporting structure. The new multiple layer boards are made possible by the discovery of new board design and new fabrication processes.

In accordance with the process of the invention, solder mount pads, circuit lines, vias and reinforcing members are formed by a selective plating process within recesses defined by an imaged permanent dielectric material. A first MLB layer is readily formed by providing a conductive support and forming an imaged dielectric layer, preferably a solder mask layer, over the support. Using the support as one electrode, metal is deposited into the recesses within the dielectric layer and onto the support to form the desired structure. By this procedure, a first layer is formed comprising the dielectric coating and metal in a desired pattern.

In a preferred embodiment of the invention, attachment of multiple chips and other components to the exterior surfaces of a finished MLB is facilitated. In this embodiment, an outerlayer of a permanent dielectric coating is used as a solder mask and imaged in a pattern of solder mount pads. Thereafter, solder or other solderable material is plated into the recesses formed by development of the dielectric. The number of pads may be increased by the process of the invention using laser ablation to form the holes or by using a high resolution light sensitive material. By deposition of solder, the solder is located on selected areas of the board as desired and the conventional steps of applying a solder mask and depositing solder on a finished board are eliminated.

Following formation of the first layer, sequential build of additional layers using electroplating procedures requires special processing steps as the first layer has a large surface area of dielectric coating, a non-conductor. The conventional electroplating process requires plating over a conductive surface. To selectively electroplate over areas of a nonconductor without shorting between circuit lines, the process involves applying a weakly conductive material over the surface to be plated, coating this material with a patterned mask having recesses defining areas to be plated and converting the material bared in the recesses to a form sufficiently conductive to permit electroplating. Conversion takes place where metal deposition is desired. The recesses having the conductive material at the base of the recesses are in electrical communication with deposited metal in the first layer. Metal is then electroplated over the conductive material and within the recesses on the surface to form a circuit layer. Electroplating occurs by current flowing from the conductive support or platen, through the electroplated metal in the first layer, solder in the preferred embodiment of the invention, and though the conductive layer within the recesses of the imaged dielectric layer to form lines, vias and/or a segment of the reinforcing member comprising the second layer of the MLB.

The above sequence of steps may be repeated as often as desired to make a multilayered board. The final layer may be a reinforcing layer or a second outerlayer having the solder mount pads for attaching chips and other electrical components. The outerlayer material may serve the dual function of an outerlayer and a support for the MLB.

In the above process, glass fiber reinforced copper clad epoxy substrates, required to provide flexural strength or rigidity to a conventional board, are not required for boards fabricated in accordance with process disclosed herein. In accordance with an additional embodiment of the invention, the flexural strength or rigidity of the MLB may be increased by incorporation of metal deposited reinforcing members passing vertically through all or a portion of the thickness of the board, horizontally over the surface of one or more layers of the board, by the use of an applied reinforcing member as the final layer in the construction of the board, or any combination of these approaches. When using deposited metal as the reinforcing material, the reinforcing members are desirably formed by metal deposition simultaneously with the deposition of metal during the process for formation of interconnections or vias and circuit lines. When using vertical reinforcing members, they are built to the full thickness of the board as each sequential layer of the MLB is formed. This is accomplished by forming one or more recesses in successive imaged dielectric coatings where the recesses are in registration with each other. The recesses are formed at the time the coating is imaged for interconnections or circuit lines. The recesses for interconnections or circuit lines and the reinforcing members are then selectively metal plated during the metal plating sequence. The sequential build-up of metal in the recesses defining the reinforcing member results in the reinforcing members passing through a portion of or the full thickness of the board. In this embodiment of the invention, the reinforcing members may be in the form of pegs, rectangular bars located at the edges or within the board, or any other shape consistent with acceptable circuit design. By strategic location of an array of reinforcing members within the board, board rigidity may be significantly increased.

The metal deposited reinforcing members used to strengthen the board may be electrically isolated from circuitry and function solely to provide rigidity to the board. However, the reinforcing members may also serve additional purposes. For example, the reinforcing members may serve as a ground plane, power plane, etc. consistent with acceptable circuit design.

In a further embodiment of the invention, two MLBs may be formed simultaneously. This is accomplished using the conductive platen with electrical leads connected to the edges of the platen. In this embodiment, circuit layers may be formed sequentially on both sides of the platen simultaneously. The platen can be a part of the board such as a power or ground plane or the MLBs on both sides of the platen can be separated to provide two separate MLBs. In this embodiment of the invention, the outerlayers would have the solder pads formed as the final step in the fabrication sequence.

Other advantages and processes of the invention will be apparent from the description that follows.

DESCRIPTION OF THE DRAWINGS

FIGS. 1 to 4 illustrate formation of an array of solder mount pads and reinforcing members over a temporary platen with FIG. 3 being an isometric representation of the pads and reinforcing members following the fabrication steps, and FIGS. 5 to 10 illustrate the formation of an array of signal lines and reinforcing members over a dielectric coating with FIG. 8 being an isometric representation of the signal lines and reinforcing members following the fabrication steps.

DESCRIPTION OF THE PREFERRED EMBODIMENTS

General

Figure 1:
FIGS. 1 to 10 of the drawings illustrate the formation of layers of an MLB where

In the description that follows, the fabrication of an MLB in accordance with the process of the invention will be described first. Materials suitable for use in the process steps will be discussed following the description of the process. In the described processes, unless otherwise stated and for purposes of illustration, the supporting structure for sequential build of the MLB is an electrically conductive temporary platen though it should be understood that other substrates may be used including those that might become a permanent part of the MLB. Examples of such permanent substrates include, for example, a housing for an item of electronic equipment, a ground or power plane, etc. Dielectric coatings used in the process may be Imaged by laser ablation or by exposure and development. Imaging details will be given in the description below for the first disclosed imaging sequence and in the discussion of imaging materials. Thereafter, for brevity, imaging details will not be discussed. Permanent dielectric coatings used are of a thickness customarily used in multilayer circuit formation. Preferably, they are approximately 1 mil in thickness though this thickness may vary from about 0.1 to 2.0 mils as would be understood as conventional by those skilled in the art. In general, thinner coatings are used with narrower signal lines and smaller diameter vias. Coating thickness of the dielectric can be controlled by the coating method and solids content of the coating material, all as known in the prior art.

Process

Metal deposition in accordance with the process described below is by electroplating. For purposes of illustration only, a temporary electrically conductive support or platen is used onto which multiple layers are sequentially applied to form a single sided reinforced MLB. The platen is metal such as stainless steel or copper and is desirably passivated to enable easy separation of the MLB from the platen. Following completion of the MLB, the stack is separated from the platen. The MLB to be fabricated following the described procedure is free of internal reinforcing substrates though structural reinforcement is desired to avoid structural deformation. In the following description, reinforcement is provided using three methods for purposes of illustration though any one or more of the three methods may be used. The methods comprise a top outerlayer reinforcing layer, relatively thick metal deposited horizontal ground and power planes and sequentially built vertical reinforcing members. It should be understood that any single reinforcing structure may be satisfactory or any two or more of the methods may be used in combination with each other.

FIGS. 1 to 10 of the drawings illustrate the formation of an MLB by a process characterized by use of a conductive passivated stainless steel temporary platen, electroplating and the use of permanent dielectric coatings. It should be understood that variations of the process are possible. For example, electroless metal plating may be substituted for the electrolytic procedures described.

Figure 2:
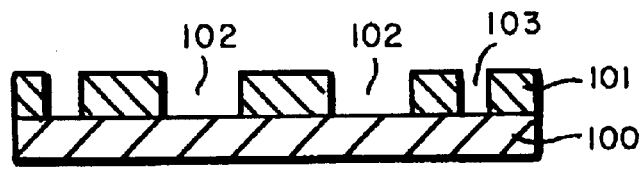

In the most preferred embodiment of the invention, the first layer of the MLB comprises solder mount pads contained within recesses of a permanent dielectric coating such as a solder mask. In this embodiment, this layer would function as the first outerlayer of the stack. To form this first layer, an imaged dielectric coating is formed on a temporary platen and cured. Metal is then deposited onto exposed portions of the platen with the platen serving as one of the electrodes during electroplating. This portion of the procedure is illustrated in FIGS. 1 to 4 of the drawings where temporary electrically conductive platen 100 is coated with a permanent dielectric layer 101. FIG. 2 illustrates the dielectric coating with imaged openings in an array of recesses for solder mount pads 102 and in the embodiment shown, reinforcing members 103 though it should be understood that this embodiment of the reinforcing members is only one of several alternatives. Pattern generation is not shown in the drawings but the pattern is generated by exposure of the dielectric coating through a mask to a source of activating radiation followed by development to provide the pattern of imaged openings 102 and 103 when contacted with a developer. Alternatively, the imaged openings may be formed by laser ablation. For boards not requiring fine line resolution, imaging may be by screening the dielectric onto the platen. Imaging procedures including laser ablation would be readily understood by those skilled in the art.

Figure 3:
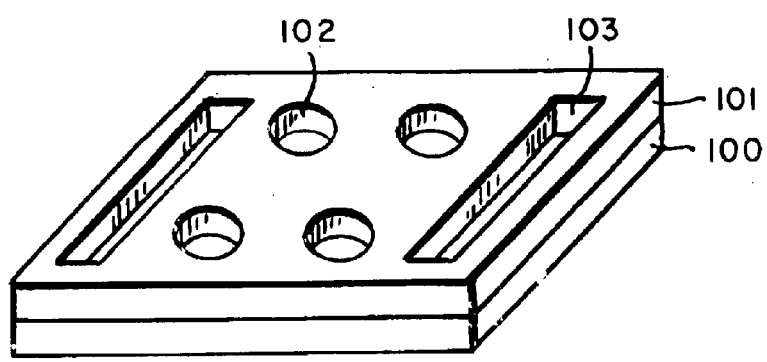

For purposes of further illustration, FIG. 3 of the drawings is an isometric view of the board of FIG. 2 and shows dielectric coating 101 containing circular recesses 102 that define the circular solder mount pads and rectangular recesses 103 for reinforcing member formation.

Figure 4:
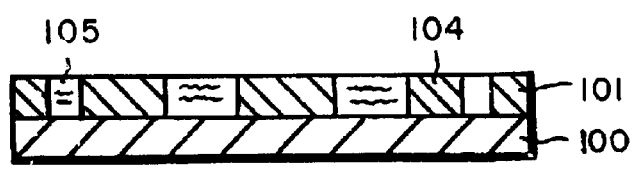

In FIG. 4, recesses 102 and 103 have been filled with electroplated solder to form mount pads 104 and reinforcing members 105. These pads are used to attach chips and other components to the finished MLB while the reinforcing members adds rigidity to the board. The solder mount pads and reinforcing members are electrically isolated from each other by permanent dielectric layer 101. Solder is readily deposited by electroplating with the platen used as an electrode in an electroplating cell equipped with a counterelectrode and containing a solder electroplating solution. Because the platen is electrically conductive, solder will build on conductive surfaces exposed to the solder electroplating solution. Plating is terminated when the solder deposit comprising solder mount pads 103 and reinforcing members 105 are level with the top surfaces of the dielectric coating 101 so that a planar layer is formed. However, in an alternative embodiment of the invention, a dissimilar metal such as copper may first be plated to fill a portion of the recesses followed by deposition of a solderable metal to fill the balance of the recesses. When the MLB is completed, the copper may be etched away to leave recesses as solder mount pads are often recessed below the surface of the board.

The next layer formed could contain a ground plane as well as circuitry. In accordance with the invention, both the ground plane and the circuitry would be formed in the same manner using selective metal deposition procedures. The method for formation of this layer is somewhat more complex than the procedures used to form the solder mount pads. From FIG. 3, it can be seen that the major portion of the surface of the MLB comprises the dielectric coating 101. To form a patterned metal deposit, metal must be deposited over the surface of the dielectric coating 101. However, the dielectric coating is a non-conductor of electricity. Conventional selective electroless metal deposition procedures can be used if desired as illustrated in the '817 patent. However, if electroplating rather than electroless plating is the desired method for formation of this layer, conventional electroplating procedures cannot be used to deposit metal because the surface is a non-conductor.

Figure 5:
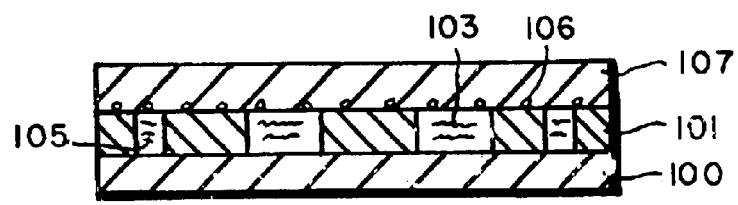
Figure 6:
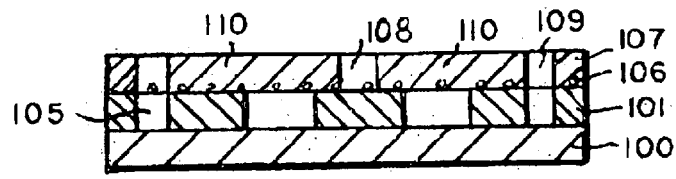

The method used to form a layer containing a ground plane is illustrated in FIGS. 5 to 8 of the drawings though the ground plane itself is not shown in the drawings. In accordance with this embodiment of the invention, as shown in FIGS. 5, a layer of poorly conductive material 106, illustrated in substantially exaggerated dimension, is deposited over the entire surface of dielectric layer 101. An additional layer of dielectric coating 107 is then applied over the layer 106. As shown in FIG. 6, the second dielectric layer 107 is then imaged in a pattern that yields recesses defining the ground plane surface segment and as illustrated, also contains signal lines 108 and reinforcing members 109. Portions of the signal lines 108 overly solder mount pads 103 while reinforcing members 109 overlay earlier formed reinforcing members 105. The purposes for positioning the reinforcing members and signal lines over the solder mount pads is first to reduce the size of the features and thereby increase circuit density and second, to provide electrical communication between the platen and signal lines. The ground plane should be electrically isolated from a major portion if not all of the solder mount pads to prevent shorting. However, electrical contact is required for metal deposition. Electrical connection can be maintained through the reinforcing members which are also electrically isolated from circuitry or through selected solder mount pads. In addition, pads of dielectric may be retained in the ground plane to permit vias to pass through the ground plane while maintaining the ground plane in electrical isolation from the vias.

Figure 7:
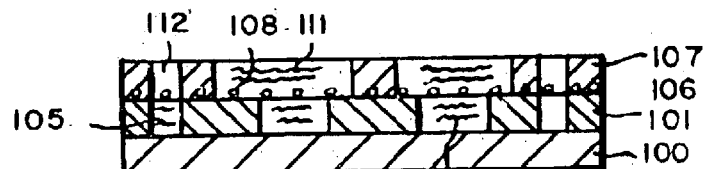

Development of dielectric layer 107 results in layer 106 being bared at the bottom of the recesses formed in dielectric coating 107. The entire surface is then contacted with a solution capable of converting bared poorly conductive layer 106 within the recesses of dielectric coating 107 to a conductive coating 110. As shown in FIG. 7, electroplating then takes place by passing a current through the platen 100. Current passes through platen 100, through the solder mount pads 103 and reinforcing members 105 and through the conductive coating 110 to form signal lines 111 and the second layer of reinforcing member 112. Current also passes through the reinforcing members 105 and/or selected solder mount pads to form the ground plane. Plating continues to the full thickness of the dielectric coating.

It should be noted that following the above procedures, an electrically conductive pathway is formed from the conductive platen, through the solder mount pads within the first layer and into the conductive coating bared in the recesses of the dielectric coating. Since there is an electrically conductive pathway between the recesses and the conductive platen, electroplating can be used for the metallization step. In one embodiment of the invention, where the poorly conductive material 106 is an electroless plating catalyst such as a tin palladium colloid, the part can first be immersed in an electroless plating solution to increase conductivity before proceeding to the electroplating step. Suitable copper electroless plating solutions are known in the art and described in greater detail below.

Figure 8:
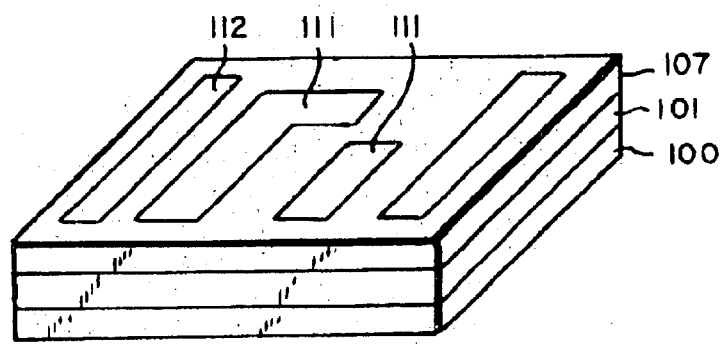

For purposes of illustration, FIG. 8 is an isometric view of the surface of the MLB at this stage in the fabrication process. From FIG. 8, it can be seen that the surface of the MLB has metal plated reinforcing members 112 and signal lines 111 confined within permanent dielectric coating 107.

Figure 9:
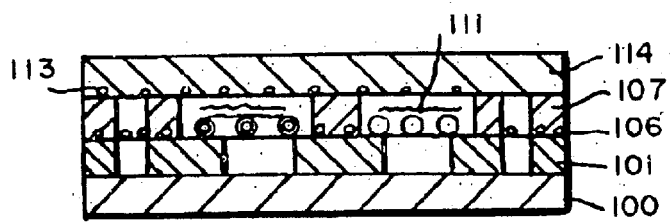
Figure 10:
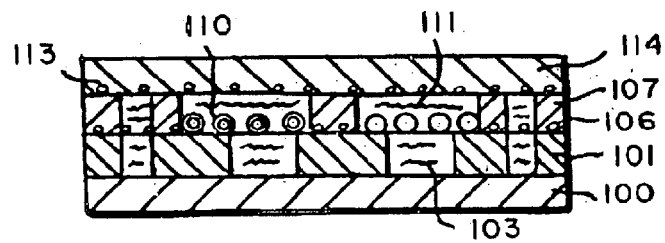

The next step in the process is to provide conductive vias from the ground plane layer to a signal layer. The process is essentially the same as used to form the preceding layer differing primarily in the patterning of the dielectric material. The process is illustrated in FIGS. 9 and 10 of the drawings. Poorly conductive material 113 is deposited onto the layer containing the ground plane. Dielectric layer 114 is coated over layer 113. The dielectric layer is imaged in an array of vias baring layer 113 within the imaged openings. The bared material in layer 113 is then converted to a conductive layer. As shown in FIG. 10, the vias are then metallized to form conductive vias 115 and to further build reinforcing members 116.

The above procedure can be repeated as often as desired to form a board having as many layers as required for a particular application. For example, with reference to the board illustrated in FIGS. 1 to 10, the board can be completed with the following sequence of layers not illustrated in the drawings and not described in detail as the procedural steps would be as described above.

Following formation of the via layer as discussed, an additional signal layer would be formed. This in turn would be followed by an additional layer of metallized vias to provide electrical connection from the solder mount pads through the entire thickness of the MLB. The layer of vias may be conveniently formed by laser drilling. The next step in the sequence could be formation of a power plane layer. The board may be completed with as many layers as desired. Finally, the outerlayer can be formed on the top surface. This layer may be one that provides structural reinforcement as necessary, an additional layer of solder connector pads, or any other outerlayer consistent with circuit design. A reinforcing layer would be applied by first coating the top layer with a buttercoat of a bonding agent to provide both a smooth surface and a layer suitable for bonding the reinforcing layer to the stack. A prefabricated dielectric could then be bonded to the buttercoat to complete the board construction. The dielectric could be a material such as an epoxy laminate, a polyimide or Mylar. Alternatively, based upon the selection of the buttercoat, it could function as the strengthening support. An additional layer of solder mask pads could be formed by coating the board with a dielectric, forming a relief pattern of solder pads and metallizing. Following completion of the board, it would be separated from the platen.

The process illustrated by FIGS. 1 to 10 of the drawings can be used to make two MLBs simultaneously. In this embodiment of the invention, both sides of a temporary platen are coated with permanent dielectric coatings. Coating both sides of the platen with the dielectric would be in accordance with art recognized procedures. For example, the platen can pass horizontally beneath a suitable coating apparatus such as a roller or slot coater to coat one side of the platen, then into a drying oven if needed, then flipped over and the procedure repeated. Alternatively, the board may be passed vertically though an array of spray nozzles or an electrostatic coater with the nozzles or coating heads placed on both sides of the platen. Once coated on both sides, the platen would then be exposed to imaging radiation, preferably on both sides simultaneously. Thereafter, with the board hanging vertically, it can be passed through a series of tanks including a tank for developer and a tank for electroplating. The procedure can be repeated as often as desired to continue the sequential processing.

It should be obvious that various steps recited in the embodiments described above may be interchanged so that modifications to the processes would be obvious to those skilled in the art. Moreover, the procedures described illustrate major steps in the process contemplated by the invention. Many of the routine procedural steps known to the art have been omitted. For example, it is known that when using organic coating materials such as the dielectric coatings contemplated herein, baking for drying and curing are recommended and recognized procedures. Likewise, to adhere one organic coating to another, it is often necessary to pretreat the coating to enhance adhesion. In catalysis processes, it is conventional to treat the catalyst with an accelerator prior to plating. To prepare copper for subsequent deposition or for adhesion of an organic coating material, it is often necessary to clean and activate the copper. These are all steps known to the art.

In the above processes described, since photoimaging dielectric coatings is used to form imaged opening into which metal deposits, reinforcing members, conductors and interconnections conform to the shape of the recesses or openings. Hence, plated conductors, reinforcing members and interconnections have a cross-section conforming to the shape of the imaged opening, typically square or rectangular conductors and circular for interconnections. Moreover, imaged openings formed by exposure and development of photoactive dielectric materials may be of any desired shape or size. In this respect, the invention permits formation of interconnections that could not be achieved with prior art processes. In accordance with the invention, openings for interconnections between layers are imaged, not drilled. Therefore, it is possible to form a multilayer board without drilling. In this respect, all vias can be formed by imaging and selective deposition or by laser imaging, though it may be desirable to drill holes from the exterior of the stack to the interior. Vias or interconnections are desirably located within the confines of circuit lines to maximize board density and to provide electrical pathways required for plating. The vias are solid pegs of metal that promote board densification. Signal lines can be relatively thin further promoting densification. In addition, the lines are deposited within the recesses of the dielectric coating and the dielectric coating may be a high resolution material promoting narrow lines, high resolution and uniform cross section. Vias may be laser drilled through one or more layers thus promoting registration between layers. The reinforcing members formed are rectangular in cross section having a width that may vary between 0.1 and 10 mils, a thickness that is preferably the full thickness of the board and a length that is almost the full length of the board. In this embodiment of the invention, the reinforcing members may be electrically isolated from the conductor lines of the board but this is not a necessity and depends upon board design. For example, there could be electrical communication with other elements of the board if it were intended that the reinforcing members provide a functional role other than strengthening the board. It should also be understood that the location, size and shape of the reinforcing members may vary dependent upon board design. Thus, the reinforcing members may be rectangular bars as illustrated, cylindrical pins or pegs, squares, etc. In addition, they can function as a ground or power plane. Electroplating may be used to deposit metal thus promoting visual inspection during all stages of fabrication. As described, internal strengthening substrates may be avoided thus providing for thinner boards or more boards having an increased number of layers. There is greater flexibility in the selection of dielectric materials between layers thus permitting use of lower K materials and materials of greater flexibility. Layers can be made in any sequence consistent with required circuit design.

Materials

The materials used to practice processes described above are defined in greater detail below.

The Dielectric Coating—The dielectric coating used in the processes of the invention should have a dielectric constant sufficient to adequately insulate conductors from each other. In this respect, a dielectric constant of not greater than 4 to 5 is preferred and a dielectric constant not exceeding 3.5 is more preferred.

When a dielectric material that is photoactive is used, it should be capable of yielding images of satisfactory resolution. The necessary resolution is dependent upon the requirements of the MLB. Preferably the resolution should be sufficient to provide line widths not exceeding 10 mils, preferably not exceeding 5 mils, and most preferably, not exceeding 2 mils. Interconnections desirably do not exceed 5 mils and preferably are of a diameter less than the line width of the signal lines. The dielectric coating material is also desirably resistant to attack by an electrolytic metal plating solution over periods of prolonged exposure. Therefore, the dielectric should be resistant to attack by acids. Materials suitable for this purpose are disclosed in U.S. Pat. Nos. 4,839,261; 4,830,953; and 4,820,549, each incorporated herein by reference.

The dielectric coating composition may be photoimageable or capable of thermal cure and is applied by any art recognized method. The photoimageable material has a light sensitive system that produces areas of differential solubility on exposure to activating radiation in an image pattern. The thermal imageable systems contain a system that cures following activation and thermal cure. Once applied, if photoimageable, it is imaged by exposure to actinic radiation of suitable wave length and developed. If thermally cured, it is imaged by laser ablation.

A preferred dielectric coating composition is photoimageable and disclosed in copending U.S. patent application Ser. No. 09/397,301 filed Sep. 15, 1999, assigned to the same assignee as the subject application and incorporated herein by reference. These dielectric compositions include at least one low dielectric constant, crosslinkable material, at least one reactive diluent and a photoactive system. The compositions may optionally include one or more of crosslinking agent(s), catalyst(s) and additive(s). Preferably, the dielectric composition includes at least one low dielectric constant, crosslinkable material, at least one crosslinking agent, at least one catalyst, at least one reactive diluent, and a photoactive compound.

Any low dielectric constant material that is curable and reacts with the reactive diluent during the activation step is suitable. By low dielectric constant material is meant a material having a dielectric constant below 4.0, and preferably below 3.0. The low dielectric constant material may be monomeric or polymeric.

Typically, the low dielectric material is present in the dielectric composition in an amount in the range of 1 to 99% by weight, based on the total weight of the composition. It is preferred that the amount of the low dielectric material is in the range of 20 to 80% by weight, and more preferably in the range of 25 to 60%.

Low dielectric materials are well known and generally commercially available. Suitable low dielectric materials are described in U.S. Pat. No. 5,262,280, incorporated herein by reference. Such materials include polybutadiene, functionalized polybutadiene, polyphenyleneoxides, functionalized polyphenyleneoxides, polyimides, functionalized polyimides, polyfluorocarbons, functionalized polyfluorocarbons and mixtures thereof. By "functionalized" is meant that the low dielectric material is substituted with a group that can be crosslinked with another compound, such as a compound containing a vinyl group, an acrylate, or an epoxy group. It is preferred that the low dielectric constant, crosslinkable material includes epoxidized polybutadiene, such as oligomeric epoxidized rubber. It will be appreciated that combinations of dielectric material may be used. Thus, mixtures of monomers and polymers are contemplated.

Reactive diluents are compounds that are miscible with all components of the composition and do not adversely affect the function of the dielectric material. The reactive diluents may be used to adjust the viscosity of the coating for various applications. For example, reactive diluents may be a low viscosity or viscosity reducing material. The reactive diluents have the advantage of functioning as solubilizing components for the compositions and also cure as part of the final coating, thus avoiding the problem of volatile organic compounds. The reactive diluents may also function as crosslinking agents. Suitable reactive diluents include, but are not limited to: (meth)acrylic acid monomers or polymers, alkyl(meth)acrylate monomers or polymers, (meth)acrylamide monomers and polymers, low molecular weight acetals, vinyl ethers, poly(vinyl ethers), polyimides, polyamides, polyetherimides, urethanes and epoxides. Preferred reactive diluents are (meth)acrylic acid monomers or polymers, alkyl(meth)acrylate monomers or polymers, (meth)acrylamide monomers and polymers and epoxies. Epoxies are more preferred as reactive diluents. The epoxies useful as reactive diluents include, but are not limited to: mono-, di- and tri-functional low viscosity epoxies, such as glycidyl butane ether and glycidyl butane diether More than one reactive diluent may be used and it should be appreciated that more than one reactive diluent may be needed to achieve a desired viscosity or solubility of the components of the composition or both. Typically, the reactive diluent is present in the compositions in a range of 1 to 99% by weight, based on the weight of the composition. It is preferred that the amount of the reactive diluent is 5 to 60% by weight, more preferably 15 to 55%, and even more preferably 20 to 50%.

Any aromatic or aliphatic crosslinking agent that reacts with the low dielectric constant material is suitable. Such crosslinking agents will cure to form a polymerized network with the low dielectric material. Such crosslinking agents may be monomers or polymers. Suitable crosslinking agents include, but are not limited to: phenolic resins, amine containing compounds, epoxy containing materials, compounds containing at least two vinyl ether groups, allyl substituted aromatic compounds, and combinations thereof. Preferred crosslinking agents include phenolic resins and amine containing compounds. Suitable phenolic resins include phenol aldehyde condensates known as the novolak resins, homopolymers and copolymers of alkenyl phenols, partially hydrogenated novolak and poly(vinylphenol) resins, polymers containing phenolic units and nonaromatic cyclic alcohol units, and homopolymers and copolymers of N-hydroxyphenyl-maleimides. The novolak resins are preferred.

The amine containing compounds useful as crosslinking agents include, but are not limited to a melamine monomer or polymer, melamine-formaldehyde resins, benzoguanamine-formaldehyde resins, urea formaldehyde resins, glycoluril-formaldehyde resins, and combinations thereof. Melamines are the preferred amine-based crosslinkers. Particularly preferred are melamine formaldehyde resins, i.e., reaction products of melamine and formaldehyde. These resins are typically ethers such as trialkylol melamine and hexaalkylol melamine. The alkyl group may have from 1 to 8 or more carbon atoms but is preferably methyl. Depending upon the reaction conditions and the concentration of formaldehyde, the methyl ethers may react with each other to form more complex units.

The epoxy containing materials useful as crosslinkers are any organic compounds having one or more oxirane rings that are polymerizable by ring opening. Such materials, broadly called epoxies, include, but are not limited to: monomeric epoxy compounds, and polymeric epoxides that may be aliphatic, cycloaliphatic, aromatic or heterocyclic. Preferred epoxy crosslinking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units e.g. polybutadiene polyepoxide), and polymers having pendant epoxy groups (e.g., glycidyl methacrylate polymer of copolymer). The epoxides may be pure compounds but are generally mixtures containing one, two or more epoxy groups per molecule. Useful epoxy-containing materials may vary from low molecular weight monomeric materials and oligomers to relatively high molecular weight polymers and may vary greatly in the nature of their backbone and substituent groups. Particularly useful epoxy containing materials include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2, 3epoxypropoxyphenol)propane). Further examples of epoxides of this type are described in U.S. Pat. No. 3,018, 262 incorporated herein by reference.

The catalysts are photoactivators or thermal activators suitable for use in the permanent dielectric coating material are any which catalyze the reaction of the low dielectric constant, crosslinkable material with the reactive diluent, and optionally any crosslinking agent. Such catalysts include, but are not limited to, photoacid generators, photobase generators, thermal acid generators, thermal base generators, and mixtures thereof. The amount of catalyst useful is any amount that catalyzes the reaction and may vary from 0.1 to 25% by weight, based on the weight of the composition. It is preferred that the catalyst is present in an amount in the range of 0.5 to 15% by weight, and more preferably in the range of 1 to 12% by weight.

The photoacid generators are any compounds which liberate acid upon exposure to light, typically at a wavelength of about 320 to 420 nanometers, however other wavelengths may be suitable. Suitable photoacid generators include halogenated triazines, onium salts, and sulfonated esters. The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., Bulletin of the Chemical Society of Japan, 42, 2924–30 (1969). Onium salts with weakly nucleophilic anions are particularly suitable for use as photoacid generators. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference.

The dielectric compositions described above are substantially free of organic solvent. By "substantially free" is meant that the compositions may include up to 5% by weight, based on the total weight of the composition, of one or more organic solvents. Preferably, the amount of organic solvent is up to 3% by weight, and more preferably up to 2%. It is especially preferred that the dielectric compositions are free of organic solvent. However, as would be known to those skilled in the art, the dielectric compositions of the invention may be solvent based in which case, the composition is applied as a liquid coating and dried.

The dielectric coating described above is readily developed by contact with a developer. The choice of developer is dependent upon the composition of the dielectric coating used. For that described in detail above, an alkaline solution having a pH in excess of 7 would be suitable. Typical developers would include aqueous solutions of sodium hydroxide and ammonium bicarbonate.

The conductive layers—Methods are known in the art for electroplating non-conductive surfaces. Such methods are referred to by the art as "direct plate". One such process, disclosed in U.S. Pat. No. 4,895,739 incorporated herein by reference, involves formation of a coating of a poorly conductive colloidal palladium plating catalyst over a surface and conversion of the plating catalyst to a conductive palladium sulfide by treatment with a sulfide salt. Palladium sulfide is moderately conductive, but is sufficiently conductive to support electroplating.

As disclosed in said patent, catalysis involves immersion of the nonconductor into an aqueous catalyst composition. The catalysts of U.S. Pat. Nos. 3,011,920, 3,874,882 and 5,421,989, each incorporated herein by reference, are preferred catalysts for this purpose. These catalysts of the first two patents comprise the product formed by the reduction of a noble or precious catalytic metal with stannous tin in acid medium. The reduction product comprises colloidal palladium. The catalyst of the latter patent is colloidal palladium having an organic protective colloid. A suitable proprietary catalyst is identified as Cataposit 44 catalyst available from Shipley Ronal Inc. Non noble metal catalysts are also suitable, but lesser preferred, especially in the manufacture of printed circuit boards using pattern plating procedures. Suitable non noble metal catalysts include copper, nickel, cobalt, etc. and are disclosed in U.S. Pat. Nos. 3,993,799 and 3,993,491 incorporated herein by reference.

The step of catalysis is accomplished by contact of the MLB with the catalyst solution for a period of time up to about 10 minutes. Following catalysis, the nonconductor may be contacted with an accelerator solution. A suitable accelerator is a mild acid solution such as hydrochloric acid or perchloric acid. Acceleration is accomplished by contact of the MLB with the aqueous solution of the accelerator for a period of time up to about 5 minutes. The step of acceleration is not mandatory. The next step in a direct plate process would comprise conversion of the palladium catalyst to a conductive species capable of supporting electroplating. However, for purposes herein, it should be realized from the discussion above that the dielectric coating would be applied and imaged whereby the palladium colloid would be bared in the recesses. The colloid in the recesses would then be made conductive by contact of the MLB with a sulfide solution. In this way, only the palladium catalyst bared in the recesses of the dielectric coating is converted to the conductive species while the colloid underlying the dielectric remains relatively non-conductive. Suitable sulfide solutions comprise divalent sulfur compounds solutions such as aqueous solutions of alkali metal sulfides though aqueous solutions of covalently bonded sulfur compounds are also suitable. Preferred materials are alkaline and alkaline earth metal sulfides such as solutions of sodium, potassium or lithium sulfide. The solution typically contains the sulfide salt in an amount up to about 15 grams per liter and contact with the sulfide solution is for a period of time up to about 5 minutes. Contact with the sulfide solution is believed to form palladium sulfide which is sufficiently conductive to support electroplating.

The above described procedure is a lesser preferred embodiment of the invention because it is not suitable for formation of high density MLBs. Colloidal palladium layer underlying the dielectric coating is a weak electrical conductor and might result in a pathway resulting in shorting between signal lines if the lines are too close together. For this reason, using colloidal palladium, it is preferred that the minimum line separation exceed 3 mils and preferably 5 mils.

A preferred material and process for formation of a conductive species in the recesses of the dielectric coating involves the use of sulfides formed from manganese oxide residues. As is known in the art, one of the conventional steps in the fabrication of circuit boards, including the MLBs of the subject invention, is treatment of a dielectric coating with a permanganate solution to roughen the surface thereby promoting adhesion of s subsequently applied metal coating. Details of permanganate pretreatment can be found in U.S. Pat. No. 4,515,829 incorporated herein by reference. The use of permanganate residues for direct plate is disclosed in U.S. Pat. No. 4,810,333 incorporated herein by reference. The use of permanganate residues can be used for selective electroplating in accordance with the subject invention.

To use permanganate for selective plating, the MLB would be contacted with a permanganate solution. The permanganate solution used has a pH in excess of 10 and preferably in excess of 13. Harsh treatment conditions are desirable with the permanganate solution being maintained at an elevated temperature, preferably in excess of 140 degrees F. Immersion time may vary from between about 3 and 10 minutes.

The next step in the process is optional. Metal surfaces such as signal lines and vias may be contacted with a mild etching solution to remove copper oxide from their surface. The solution used is one that removes the residues from copper without attacking the surface of the dielectric. A suitable etching solution is a mild aqueous acid solution such as a sulfuric acid solution in a concentration of from about 5 to 25% by weighed. Room temperature treatment is suitable for a time sufficient to remove the residue.

Following mild etching, the imaged dielectric coating is formed and the manganese oxide residues within the recesses is converted to a conductive species. This is accomplished by conversion of the permanganate residues to a layer believed to be manganese sulfide. Sulfide formation occurs by contact of the manganese oxide residue with a solution of a sulfide salt. The sulfide solutions described above with respect to conversion of palladium colloids to sulfide in the concentrations given are suitable. Treatment with the sulfide solution results in conversion of the layer of manganese residues to a yellow conversion coating. The yellow conversion coating does not appear to be suitable for direct electroplating and is further reacted by treatment with a metal ion solution. The metal is preferably selected from Groups IA, IB and VIII of the Periodic Table of the Elements. It is believed that this treatment results in replacement of a majority of the manganese by the metal of the treatment solution resulting in the formation of a metal sulfide coating.

The metal salt solution used is preferably a solution of a cobalt, nickel, copper or iron, copper and nickel being most preferred. The anion of the salt is not critical provided it does not interfere with replacement of manganese by the metal, and further, provided that the anion does not interfere with the subsequent plating reaction. Sulfates are preferred and nickel sulfate is the most preferred salt for purposes herein. The concentration of the metal in aqueous solution is not critical. Solutions containing the metal salt in concentrations of from 5 to 25% by weight of solution are satisfactory. Treatment conditions are routine with room temperature being satisfactory. The coating formed is black and sufficiently conductive for electroplating.

In a further embodiment of the invention, once the first patterned layer of metal deposit is formed, the metal is activated by treatment with an acid. A layer of imaged dielectric is coated over the prior layer. The exposed metal surfaces to be further metallized are then coated with a thin layer of electroless metal using procedures known to the art. This enhances the conductivity of the areas to be plated. Thereafter, electrolytic metal plating procedures are used.

The Plating Chemicals—Copper and solder electroplating solutions are well known in the art. Details of such solutions can be found in U.S. Pat. Nos. 3,615,733 and 3,615,732 incorporated herein by reference.

The following example illustrate the manner in which the process of the invention can be employed to make circuit boards.

The starting material would be a platen comprising a rigid passivated steel plate.

Step 1—The platen is cleaned to remove dirt and other undesired films and coated with a 100 percent solids photoactive dielectric coating to provide a coating having a thickness of about 2.5 mils. A suitable dielectric coating would have the following composition where all percentages are weight percentages:

| | |
|---|---|
| Epoxidized rubber oligomer | 28.0 percent |
| Cresol novolak resin | 14.0 percent |
| Melamine crosslinker | 6.5 percent |
| Thermal acid generator [Nacure 5225] | 1.0 percent |
| Fumed silica | 2.5 percent |
| Leveling agent | 0.5 percent |

-continued

| | |
|---|---|
| Wetting agent | 0.1 percent |
| Monofunctional low viscosity epoxy | 23.7 percent |
| Difunctional low viscosity epoxy | 23.7 percent |

Step 2—The platen coated with the dielectric would be dried and cured by placing the same in an over and dried at a temperature of 150° C. for 2 hours.

Step 3—The dielectric is exposed to activating radiation and developed by immersion in a developer such as ammonium hydroxide at room temperature for 10 minutes to form recesses defining solder mount pads and reinforcing members. The solder mount pads are circular with a diameter of 2 mils and the reinforcing members run almost the full length of the platen and have a width of 5 mils.

Step 4—Electroplate solder into the recesses and onto the platen to the full thickness of the dielectric coating by immersion in an electrolytic solder deposition solution. Such solutions and the method of use of the same are known in the art.

Step 5—Permanganate pretreatment—Immerse in a solvent pretreatment solution such as a 25 percent butylcarbitol solution in sodium hydroxide to pH 13 for 10 minutes at 180° F. for 10 minutes followed by immersion in alkaline permanganate solution having the following composition:

| | |
|---|---|
| Potassium Permanganate | 65 grams per liter |
| Sodium Hydroxide | to pH 13 |
| Water | to 1 liter |

Immersion should be for 10 minutes at 180° F. followed by a cold water rinse.

Step 6—Coat with dielectric coating from step 2 and expose and image in accordance with Step 3 to form a series of recesses defining signal lines and reinforcing members. The signal lines would have a width of xx mils and a portion of the signal lines would overly the solder mount pads. The reinforcing members would be in registration with the reinforcing members formed in the prior layer.

Step 7—Treat with a 10 percent by weight aqueous thiosulfate solution for 10 minutes and room temperature.

Step 8—Treat with a 10 percent by weight copper sulfate solution at room temperature for 10 minutes.

Step 9—Electroplate copper to desired thickness using a commercially available acid plating bath such as Electroposit 890 at 180° F.].

Step 10 Repeat steps to form interconnects over circuit lines and reinforcing members.

Though the invention his been described using the example set forth above, it should be understood that alternative embodiments within the scope of the invention would be apparent to those skilled in the art.

What is claimed is:

1. A multilayer circuit board comprising:
  at least two circuit layers separated from each other by a dielectric coating, the circuit layers being in electrical communication with each other through conductive interconnections,
  the multilayer circuit board being characterized by the absence of one or more dielectric reinforcing members, but having one or more reinforcing members that comprise electroplated copper and selected from the group consisting of i) at least one solid metal depositing member passing vertically through a major portion of the full thickness of the multilayer board, and ii) at least one metal deposited planar member horizontally disposed in the multilayer stack,
  wherein one or more reinforcing members are electrically insulated from circuitry of the circuit board and pass vertically through substantially the full thickness of the multilayer circuit board.

2. The multilayer circuit board of claim 1 wherein the circuit board has multiple reinforcing members.

3. The multilayer circuit board of claim 1 wherein the reinforcing member is a planar layer of electrodeposited copper.

4. The multilayer circuit board of claim 1 wherein one or more reinforcing members are in electrical isolation from circuitry.

5. The multilayer circuit board of claim 1 wherein one or more reinforcing members are ground or power planes.

6. The multilayer circuit board of claim 1 wherein one or more reinforcing members is a dielectric rigid outerlayer.

7. A multilayer circuit board comprising:
  at least two circuit layers separated from each other by a dielectric coating, the circuit layers being in electrical communication with each other through conductive interconnections,
  the multilayer circuit board characterized by the absence of one or more internal dielectric reinforcing members, but having one or more reinforcing members that is a planar layer of electrodeposited copper, wherein one or more reinforcing members are electrically insulated from circuitry of the circuit board and pass vertically through substantially the full thickness of the multilayer circuit board.

8. The multilayer circuit board of claim 7 wherein the circuit board has multiple reinforcing members.

9. The multilayer circuit board of claim 7 wherein one or more reinforcing members are in electrical isolation from circuitry.

10. The multilayer circuit board of claim 7 wherein one or more reinforcing members are ground or power planes.

11. The multilayer circuit board of claim 7 wherein the circuit board comprises a reinforcing member that is a rigid outerlayer.

12. A method for the formation of a sequential build circuit board, comprising:
  applying a dielectric coating onto a support;
  forming recesses in the dielectric coating that define openings for at least one reinforcing member;
  depositing copper metal into the recesses to form a first layer;
  applying a second dielectric coating onto the first circuit layer;
  forming recesses in the second dielectric coating that define openings for at least one reinforcing member in registration with the one or more reinforcing members in the first layer;
  depositing metal into the recesses in the dielectric coating to form the second layer; and repeating the process to form a sequential build board having the desired number of layers,
  wherein one or more of the reinforcing members pass vertically through substantially the full thickness of the multilayer circuit board.

13. The method of claim 12 wherein the recesses in one of the dielectric coatings define circuit lines and reinforcing members.

14. The method of claim 12 wherein the recesses in one of the dielectric coatings define interconnections and at least one reinforcing member.

15. The method of claim 12 wherein multiple reinforcing members are use and each is cylindrical or rectangular and passes through a major portion of the board.

16. The method of claim 12 wherein one or more reinforcing members are ground or power planes.

17. The method of claim 16 wherein the one or more reinforcing members are in electrical isolation from circuitry.

18. A method for formation of a sequential build circuit board, comprising:

applying a dielectric coating to a support;

forming recesses in the dielectric coating that define openings for interconnections;

depositing metal into the recesses to form a first layer;

applying a second dielectric coating onto the first layer;

forming recesses in the second dielectric coating that define openings including openings for signal lines;

depositing metal into the recesses in the dielectric coating to form the second layer;

repeating the process to form a sequential build board having the desired number of layers, the circuit board having at least one of the sequentially built layers provided with a planar electrodeposited copper reinforcing member over at least a portion of its surface and the circuit board being characterized by the absence of one or more internal dielectric reinforcing members, and wherein one or more of the reinforcing members pass vertically through substantially the full thickness of the multilayer circuit board.

19. The method of claim 18 wherein the reinforcing member is a ground plane or a power plane.

20. The multilayer circuit board of claim 1 wherein the one or more reinforcing members function solely to provide rigidity to the circuit board.

21. The multilayer circuit board of claim 1 further comprising at least one rigid outerlayer.

22. The multilayer circuit board of claim 7 wherein the one or more reinforcing members function solely to provide rigidity to the circuit board.

23. The multilayer circuit board of claim 7 further comprising at least one rigid outerlayer.

* * * * *